US010916602B2

(12) United States Patent
Yu et al.

(10) Patent No.: US 10,916,602 B2
(45) Date of Patent: Feb. 9, 2021

(54) BASE PLATE, METHOD FOR MANUFACTURING THE SAME AND DISPLAY PANEL

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Shirong Yu, Beijing (CN); Qingyong Meng, Beijing (CN); Chunhui Wu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 67 days.

(21) Appl. No.: 15/993,908

(22) Filed: May 31, 2018

(65) Prior Publication Data

US 2019/0051712 A1 Feb. 14, 2019

(30) Foreign Application Priority Data

Aug. 11, 2017 (CN) .......................... 2017 1 0691063

(51) Int. Cl.
*H01L 27/32* (2006.01)
*H01L 51/52* (2006.01)
*H01L 51/56* (2006.01)
*H01L 51/00* (2006.01)

(52) U.S. Cl.
CPC ...... *H01L 27/3246* (2013.01); *H01L 51/0005* (2013.01); *H01L 51/5203* (2013.01); *H01L 51/56* (2013.01)

(58) Field of Classification Search
None
See application file for complete search history.

(56) References Cited

U.S. PATENT DOCUMENTS

2005/0071969 A1* 4/2005 Sirringhaus ......... H01L 51/0508 29/4.51

FOREIGN PATENT DOCUMENTS

| | | |
|---|---|---|
| CN | 104659287 A | 5/2015 |
| CN | 104752490 A | 7/2015 |
| CN | 105590957 A | 5/2016 |
| CN | 106783918 A | 5/2017 |

OTHER PUBLICATIONS

First Office Action dated Jun. 13, 2019 corresponding to Chinese application No. 201710691063.X.

* cited by examiner

*Primary Examiner* — Hrayr A Sayadian
(74) *Attorney, Agent, or Firm* — Nath, Goldberg & Meyer; Joshua B. Goldberg

(57) ABSTRACT

The embodiments of the present disclosure provide a base plate, a manufacturing method thereof and a display panel, relating to the field of display technology. Ink droplets in grooves defined by a pixel defining layer can be spread uniformly, thereby effectively improving the product quality and the display effect. The base plate comprises a substrate and a pixel defining layer arranged on the substrate, wherein the pixel defining layer comprises dams and several micron-sized protrusions arranged on the upper surfaces and sides of the dams; and the protrusions have lyophobic property.

10 Claims, 3 Drawing Sheets

BASE PLATE, METHOD FOR MANUFACTURING THE SAME AND DISPLAY PANEL

FIELD

The present disclosure relates to the field of display technology, and specifically, relates to a base plate, a method for manufacturing the same and a display panel.

BACKGROUND

At present, for OLED displays, inkjet printing is generally applied to large-sized substrates, and even to larger-sized substrates in high-generation production lines. Moreover, the ink jet printing has a high material utilization rate and can save 90% of raw materials compared to an evaporation process. In addition, the ink jet printing technology can effectively prolong the service life of a product.

However, the ink jet printing also has problems. Specifically, in order to define sub-pixel regions, a pixel defining layer needs to be formed before the ink jet printing, such that ink droplets of an organic material can smoothly enter grooves of the sub-pixel regions, which imposes higher requirements for the dams of the pixel defining layer. For example, for the ink jet printing, the dams should has a lyophobic property which contributes to the flow smooth of the ink droplets and the splashing sporadic ink droplets into the grooves without residual ink droplets remain on the dams; and it needs to prevent the ink droplets from climbing along the two sides of the dams during drying by which a coffee-ring with thick edge and thin middle will be resulted and thereby bring non-uniform display.

SUMMARY

The present disclosure provides a base plate, a method for manufacturing the same and a display panel, in which ink droplets in grooves defined by a pixel defining layer can be spread uniformly, thereby improving product quality and display effect effectively.

In order to achieve the above objective, the present disclosure adopts the following technical solutions.

In a first aspect, the present disclosure provides a base plate, including a substrate and a pixel defining layer arranged on the substrate, wherein the pixel defining layer includes dams and a plurality of micron-sized protrusions arranged on the upper surfaces and sides of the dams; and the protrusions have lyophobic property.

Optionally, the protrusions have the same size and are arranged at equal intervals.

Optionally, the protrusions have a diameter in the range of 0.5-5 μm, and a distance between the adjacent protrusions is in the range of 0.5-5 μm.

Optionally, the protrusions are made of a negative photoresist material.

Optionally, the base plate further includes an organic material function layer arranged in grooves defined by the pixel defining layer, and the protrusions on the sides of the dams are disposed above the organic material function layer.

In a second aspect, the present disclosure provides a display panel, including the base plate described in the first aspect.

In a third aspect, the present disclosure provides a method for manufacturing a base plate, including forming a pixel defining layer on a substrate, wherein forming the pixel defining layer includes: a step of forming dams; and a step of forming a plurality of protrusions on the upper surfaces and sides of the dams, wherein the protrusions have lyophobic property.

Optionally, the protrusions have the same size and are arranged at equal intervals.

Optionally, the step of forming a plurality of protrusions on the upper surfaces and sides of the dams includes, forming a negative photoresist material layer on the substrate on which the dams are formed, and forming a plurality of protrusions on the upper surfaces and sides of the dams by exposing and developing the negative photoresist material layer with a mask; wherein the mask includes first openings and second openings, the first openings are used for forming the protrusions on the upper surfaces of the dams, and the second openings are used for forming the protrusions on the sides of the dams. The diameter ratio of the first openings to the protrusions is 5:1 to 5:4; the diameter of the first openings is b, and the center distance of the adjacent first openings is y; the diameter of the second openings is $a=b\times\cos\theta$, and the center distance of the adjacent second openings is $x=y\times\cos\theta$; and $\theta$ is an inclined angle of the side of the dam over the horizontal plane.

Optionally, the method for manufacturing the base plate further includes: forming an organic material function layer by an inkjet printing process in grooves defined by the pixel defining layer, wherein the protrusions on the sides of the dams are located above the organic material functional layer.

DESCRIPTION OF THE FIGURES

To describe the technical solutions in the embodiments of the present disclosure or in the prior art more clearly, the accompanying drawings for use in describing the embodiments or the prior art are described below briefly. Apparently, the accompanying drawings in the following description show only some embodiments of the present disclosure, and a person of ordinary skill in the art may still derive other drawings from these accompanying drawings without inventive efforts.

DETAILED DESCRIPTION OF EMBODIMENTS

A clear and complete description will be made to the technical solutions in the embodiments of the present disclosure below in combination with the drawings in the embodiments of the present disclosure. Apparently, the embodiments described are only part of the embodiments of the present disclosure, rather than all of them. All other embodiments obtained by a person of ordinary skill in the art based on the embodiments of the present disclosure without creative efforts shall fall within the protection scope of the present disclosure.

Figure 1:
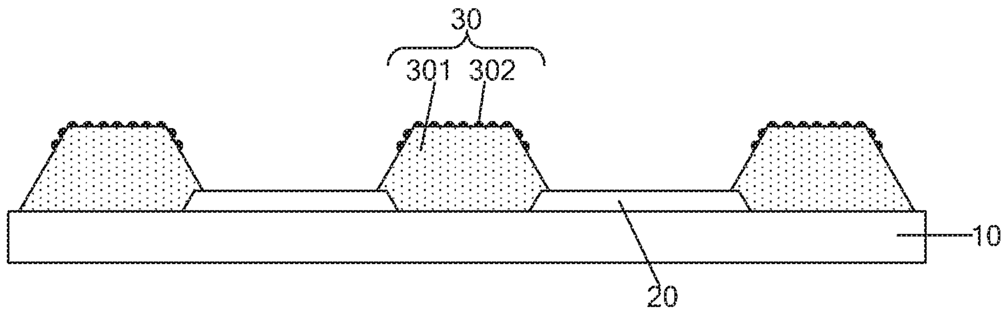
FIG. 1 is a schematic diagram of a base plate including a pixel defining layer according to the present disclosure.

Some embodiments of the present disclosure provide a base plate, as shown in FIG. 1, including a substrate 10 and a pixel defining layer 30 arranged on the substrate 10, wherein the pixel defining layer 30 includes dams 301 and a plurality of micron-sized protrusions 302 which are arranged on the upper surfaces and sides of the dams 301, and the protrusions 302 have lyophobic property.

In the present disclosure, many micro protrusions 302 having the lyophobic property may constitute a micro lyophobic structure similar to the surface of a lotus leaf, and thus may show a super-lyophobic property called as "lotus effect".

The sides of the dams 301 are inclined, and therefore, the ink droplets dripping or splashing on the sides of the dams 301 can roll down based on the "lotus effect".

For the upper surfaces of the dams 301, part of the ink droplets dripping or splashing on the upper surfaces of the dams 301 can also roll down based on the "lotus effect".

When the upper surfaces of the dams 301 are in a horizontal plane, if residual ink droplets affect the subsequent process, it is advisable to change the inclination of the upper surfaces by process control, so that the ink droplets dripping or splashing on the upper surfaces of the dams 301 could roll down. If the residual ink droplets do not affect the subsequent process, it is not need to change the inclination of the upper surfaces, and it suffices that the upper surfaces are on a horizontal plane.

Corresponding layers can be formed by inkjet printing in the grooves defined by the pixel defining layer 30, the layers formed by the inkjet printing will be in contact with the sides of the dams 301, and the upper surfaces of all the layers as a whole is lower than the upper surfaces of the dams 301. Thus, when the protrusions 302 are arranged on the sides of the dams 301, only the portions of the dams 301 above the layers formed by the inkjet printing are provided with the protrusions, so as to avoid non-uniform layers formed by inkjet printing and further abnormal display.

With regard to materials for the protrusions 302, the main material thereof should have lyophobic property. The main material may be selected according to the material used for the inkjet printing. When aqueous ink droplets are used for printing, the main material should have hydrophobic property. When oily ink droplets are used for printing, the main material should have oleophobic property.

The main material refers to a material that plays a major role in the material of the protrusions 302.

The upper surfaces of the dams described in the present disclosure are the surfaces of the dams opposite to the substrate 10.

The substrate 10 may be a flexible substrate or a rigid substrate such as a glass substrate.

Before the pixel defining layer 30 is formed, other structures may be formed on the substrate 10 as needed, which is not limited herein.

Some embodiments of the present disclosure provide a base plate. Since the pixel defining layer 30 comprises dams 301 and a plurality of protrusions 302 which are arranged on the upper surfaces and sides of the dams 301, numerous micro protrusions 302 having lyophobic property may constitute a micro lyophobic structure similar to the surface of a lotus leaf, and thus may show a super-lyophobic property called as "lotus effect". Therefore, the protrusions enable the ink droplets dripping to the upper surface of the pixel defining layer 30 to roll into the grooves defined by the pixel defining layer 30, and also enable sporadic ink droplets splashing during ink jet printing to slip into the grooves, thereby effectively reducing the residue of the ink droplets on the upper surfaces of the pixel defining layer 30 and reducing the adverse effect on the subsequent process. In addition, during the drying process of the ink droplets in the grooves, the protrusions 302 on the sides of the dams themselves and the lyophobic property thereof can play a blocking role, so that the climbing effect of the ink droplets is effectively reduced, the ink droplets in the grooves are spread uniformly, poor display caused by the formation of coffee rings is avoided, and the product quality and the display effect are improved accordingly. Due to the above effect of the protrusions, the ink jet printing can be implemented by using large ink droplets, which can also achieve an accurate printing effect as the same of small ink droplets, thereby effectively improving the production efficiency, reducing the requirement on the accuracy of equipment in the ink jet printing process, and providing a possibility of applying the ink jet printing process to higher-definition display products.

Optionally, the plurality of protrusions 302 have the same size and are arranged at equal intervals. As such, the best super-lyophobic property can be achieved on the surfaces of the dams 301.

Optionally, the protrusions 302 have a diameter in the range of 0.5-5 μm, and a distance between the adjacent protrusions 302 is in the range of 0.5-5 μm. As such, the process is also easy to operate while the lyophobic effect is ensured. If the diameter of the protrusions 302 and the distance between the adjacent protrusions 302 are too large, the lyophobic effect cannot be achieved, and if they are too small, the process cannot be realized.

The size of the dams 301 may be determined according to different types of products. For example, any cross section of the dams 301 may have a width in the range of 5-20 μm, and a height in the range of 10-20 μm.

Optionally, the protrusions 302 are made of a negative photoresist material. The protrusions 302 could be formed by a normal photo lithography process using yellow light (including photoresist applying, exposure and development), so the process is simple.

Optionally, the dams 301 are made of a negative photoresist material. The dams 301 could be formed by a normal photo lithography process using yellow light, so the process is simple.

It needs to be noted that, although both the protrusions 302 and the dams 301 can be made of a negative photoresist material, the protrusions 302 need to have the lyophobic property, so the main materials of them are usually different.

Taking the negative photoresist material being a negative photoresist for an example, the main material of the negative photoresist for preparing the dams 301 may comprise polyacrylic resin and epoxy resin; and the negative photoresist for preparing the protrusions 302 may be obtained by modifying the main material for preparing the dams 301 so as to have the lyophobic property. The modification includes, but is not limited to, adding alkane chains, esters or benzene rings to the main chain of the photoresist main material (e.g., polyacrylic resin). The modified material includes, but is not limited to, a copolymer composed of two or more monomers of acrylic acid, isobutylene, methacrylate and styrene. Of course, the negative photoresist for preparing the protrusions 302 can also be selected from other materials having lyophobic properties, which include but are not limited to, silane polymers or fluorocarbons, such as polytetrafluoroethylene, polydimethylsiloxane, etc.

Figure 2:
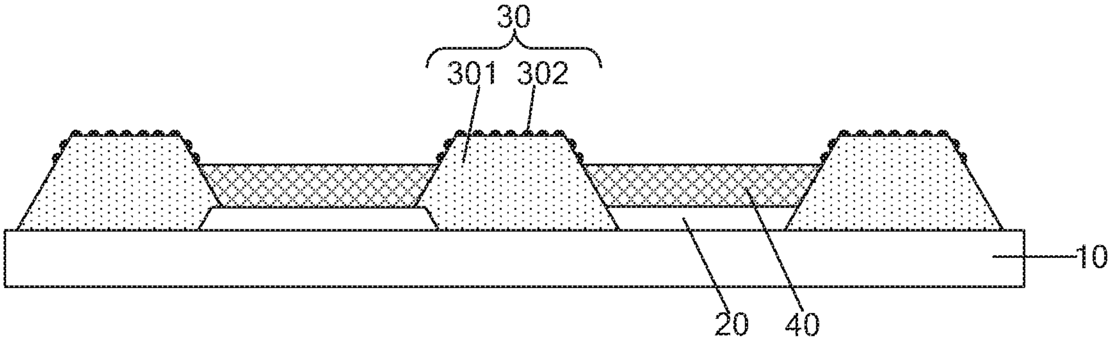
FIG. 2 is a schematic diagram of a base plate including a pixel defining layer and an organic material function layer according to the present disclosure.

As shown in FIG. 2, the base plate further includes an organic material functional layer 40 arranged in the grooves defined by the pixel defining layer 30. The protrusions 302 on the sides of the dams 301 are disposed above the organic material functional layer 40. That is, the organic material functional layer 40 is not in contact with the protrusions 302.

Figure 3:
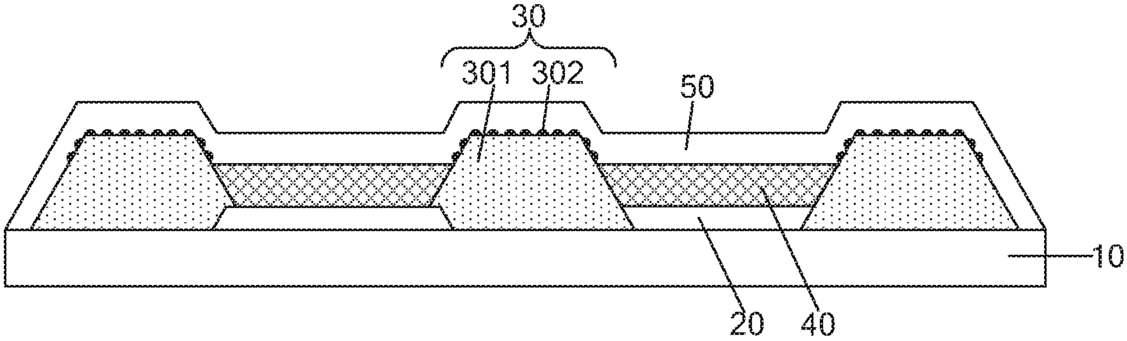
FIG. 3 is a schematic diagram of a base plate including a pixel defining layer and an OLED display element according to the present disclosure.

As shown in FIG. 3, the base plate further includes a first transparent electrode 20 and a second transparent electrode 50 on two sides of the organic material functional layer 40. That is, the first transparent electrode 20, the organic material functional layer 40 and the second transparent electrode 50 constitute an OLED display element.

Each layer of the organic material function layer 40 may be formed by inkjet printing, respectively. The organic material functional layer 40 may include a hole injection layer, a hole transport layer, a light emitting layer, an electron transport layer and an electron injection layer. The first transparent electrode 20 may be formed through a composition process prior to the pixel defining layer 30. The second transparent electrode 50 may be formed above the organic material functional layer 40 through an evaporation process. The first transparent electrode 20 may be an anode, and the second transparent electrode 50 may be a cathode; alternatively, the first transparent electrode 20 may be a cathode, and the second transparent electrode 50 may be an anode.

Since the second transparent electrode 50 does not need to be spaced among sub-pixels, a fine metal mask is not needed. Therefore, the second transparent electrode 50 may still be prepared on the large-sized substrate by adopting the evaporation process.

According to some embodiments of the present disclosure, the organic material functional layer 40 is formed by ink jet printing in the grooves defined by the pixel defining layer 30 composed of the dams 301 and the protrusions 302, so that when the prepared base plate is applied to a display device, the display device has high quality and stable performance, and the OLED display element has a longer service life.

Some embodiments of the present disclosure further provide a display panel, including the above base plate. It has the same beneficial effects as the above base plate and will not be redundantly described here. When a sub-pixel area defined by the pixel defining layer 30 includes an OLED display element, the display panel may display images in a self-illumination manner.

Some embodiments of the present disclosure further provide a method for manufacturing a base plate, including forming a pixel defining layer on a substrate. As shown in FIG. 1, forming the pixel defining layer 30 includes: a step of forming dams 301; and a step of forming a plurality of protrusions 302 on the upper surfaces and sides of the dams 301, wherein the protrusions 302 have lyophobic property.

Here, the dams 301 may be made of a negative photoresist material, and the dams 301 may be prepared by conventional technical means such as ink jet printing through a normal photo lithography process using yellow light.

In order to form the protrusions 302 on the sides of the dams 301, the inclined angles of the sides of the dams 301 over the horizontal plane should be acute angles.

For the dams 301, when the upper surfaces of the dams 301 are in a horizontal plane, if residual ink droplets affect the subsequent process, the inclination of the upper surfaces may be changed through process control, so that the ink droplets dripping or splashing to the upper surfaces of the dams 301 roll down. If the residual ink droplets do not affect the subsequent process, the inclination of the upper surfaces does not need to be changed, and it suffices that the upper surfaces are on a horizontal plane.

Corresponding layers can be formed by inkjet printing in the grooves defined by the pixel defining layer 30, the layers formed by the inkjet printing will be in contact with the sides of the dams 301, and the upper surfaces of all the layers as a whole is lower than the upper surfaces of the dams 301. Thus, when the protrusions 302 are arranged on the sides of the dams 301, only the portions of the dams 301 above the layers formed by the inkjet printing are provided with the protrusions.

Preferably, the plurality of protrusions 302 have the same size and are arranged at equal intervals. As such, the best super-lyophobic property can be achieved on the surfaces of the dams 301.

Figure 4:
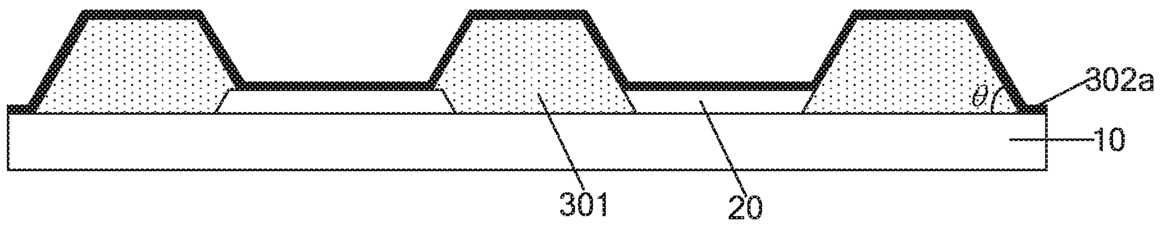
FIG. 4 is a schematic diagram of forming a negative photoresist material layer on a substrate on which dams is formed according to the present disclosure.

The step of forming a plurality of protrusions 302 on the upper surfaces and sides of the dams 301 includes the following steps:

S10, as shown in FIG. 4, forming a negative photoresist material layer 302*a* on the substrate 10 on which the dams 301 are formed.

The selection of the negative photoresist material layer 302*a* also depends on the material for the inkjet printing. When aqueous ink are used for printing, the negative photoresist material in the negative photoresist material layer 302*a* should have hydrophobic property, so that the protrusions 302 made of a hydrophobic material can show a super-hydrophobic "lotus effect" with a contact angle >150°. When oily ink are used for printing, the protrusions 302 should have oleophobic property, so that the protrusions 302 made of an oleophobic material can show a super-oleophobic "lotus effect" with a contact angle >150°. Here, the term "contact angle" refers to an inclined angle θ between the tangent of a gas-liquid interface at the three-phase intersection point of gas, liquid and solid on the liquid side and the boundary of solid and liquid, which is a measure of the degree of wetting. The contact angle may be more than 150° by adjusting the lyophobic property of the main material and controlling the post-treatment process parameters. For example, the contact angle can be more than 150° by increasing the content of the main material having the lyophobic property and prolonging the plasma lyophobic treatment time or improving the plasma lyophobic treatment strength.

S11, forming a plurality of protrusions 302 on the upper surfaces and sides of the dams 301 (refer to FIG. 1) by exposing and developing the negative photoresist material layer 302 with a mask.

Figure 5:
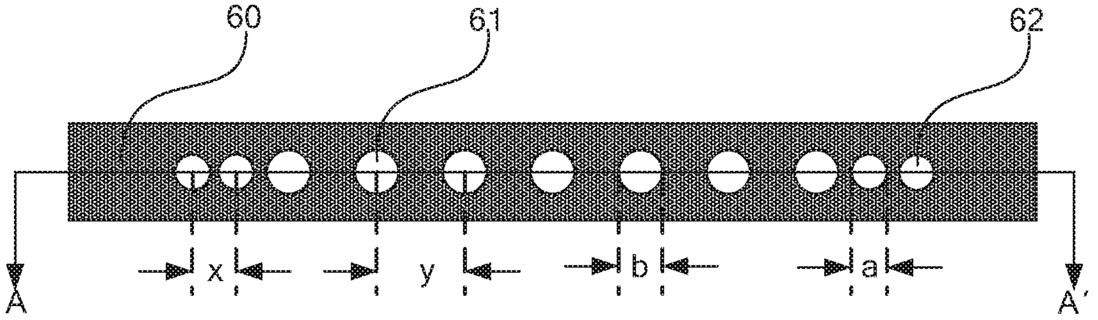
FIG. 5 is a schematic diagram of a mask according to the present disclosure.
Figure 6:
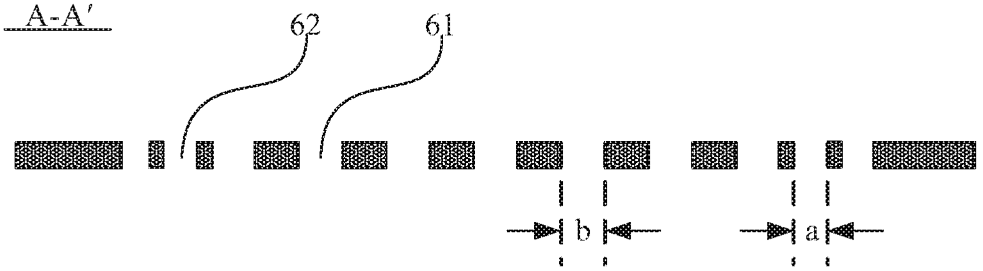
FIG. 6 is a sectional diagram along the AA' direction of FIG. 5.

As shown in FIGS. 5 and 6, the mask 60 includes first openings 61 and second openings 62, the first openings 61 are used for forming protrusions 302 on the upper surfaces of the dams 301, and the second openings 62 is used for forming protrusions 302 on the sides of the dams 301.

According to the processing capability of the photo lithography process, the diameter ratio of the first openings 61 to the protrusions 302 may be set to 5:1 to 5:4. The diameter of the first openings 61 is b, and the center distance of the adjacent first openings 61 is y. In view of the thickness and slope of the dams, the diameter of the second openings 62 may be set to $a=b\times\cos\theta$, and the center distance of the adjacent second openings 62 is $x=y\times\cos\theta$; and θ is an inclined angle of the side of the dam 301 over the horizontal plane.

FIG. 5 only shows a part of the mask 60 corresponding to one dam 301.

Figure 7:
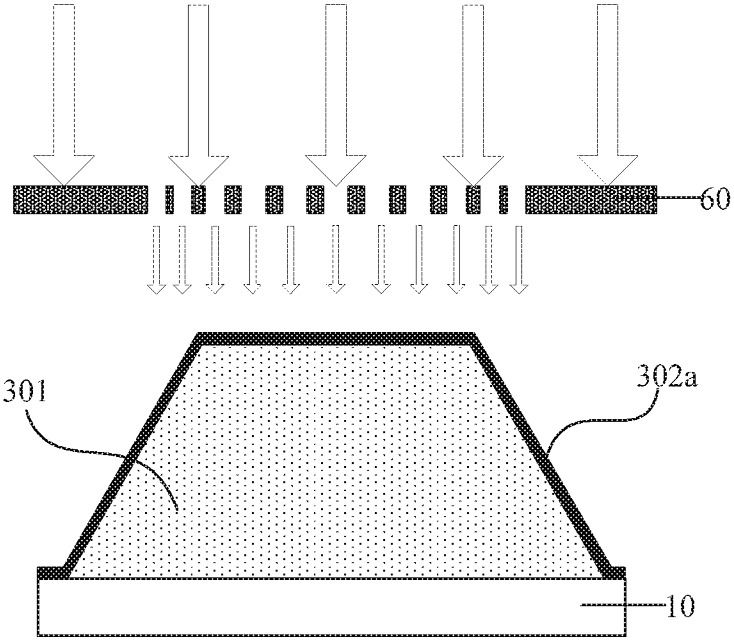
FIG. 7 is a schematic diagram of exposing the negative photoresist material layer using the mask of FIG. 5 according to the present disclosure.

The protrusions 302 formed on the upper surface and the sides of a dam 301 are illustrated. As shown in FIG. 7, the part of the mask 60 of FIG. 5 may correspond to the dam 301, the first openings 61 corresponds to the upper surfaces of the dam 301, and the second openings 62 correspond to the sides of the dam 301. After exposure, light is irradiated to the negative photoresist material layer 302*a* through the first openings 61 and the second openings 62 in the mask 60, while the unexposed part is removed after development, thus the protrusions 302 arranged at equal intervals on the upper surfaces and sides of the dam 301 and having the same size are formed as shown in FIG. 1.

According to the embodiment of the present disclosure, a negative photoresist material layer 302*a* is formed on the substrate 10 having the dams 301, and the protrusions is formed just by exposing and developing (i.e., a yellow light process) the negative photoresist material layer 302*a*, so the process is simple.

Figure 8:
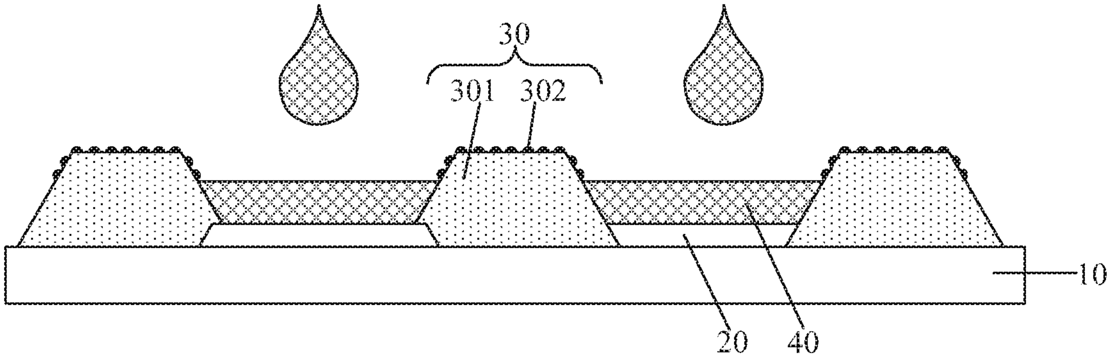
FIG. 8 is a schematic diagram of forming an organic material functional layer by inkjet printing according to the present disclosure.

The method for manufacturing the base plate may further include: as shown in FIG. 8, forming an organic material functional layer 40 by an inkjet printing process in the grooves defined by the pixel defining layer 30, wherein the protrusions 302 on the sides of the dams 301 are disposed above the organic material functional layer 40.

As shown in FIG. 3, the method for manufacturing the base plate may further include: forming a first transparent electrode 20 and a second transparent electrode 50 on two sides of the organic material functional layer 40. That is, the first transparent electrode 20, the organic material functional layer 40 and the second transparent electrode 50 constitute an OLED display element.

The first transparent electrode 20 may be formed prior to the pixel defining layer 30. The second transparent electrode 50 may be formed above the organic material functional layer 40 through an evaporation process. The first transparent electrode 20 may be an anode, and the second transparent electrode 50 may be a cathode; alternatively, the first transparent electrode 20 may be a cathode, and the second transparent electrode 50 may be an anode.

Further, before the first transparent electrode 20 is formed, a thin film transistor may also be formed on the substrate 10.

According to the embodiment of the present disclosure, the organic material functional layer 40 is formed by ink jet printing in the grooves defined by the pixel defining layer 30 composed of the dams 301 and the protrusions 302, so that when the prepared base plate is applied to a display device, the display device has high quality and stable performance, and the OLED display element has a longer service life.

Described above are specific embodiments of the present disclosure only, but the protection scope of the present disclosure is not limited thereto, any technical person familiar with this art could readily think of variations or substitutions within the disclosed technical scope of the present disclosure, and these variations or substitutions shall fall within the protection scope of the present disclosure. Thus, the protection scope of the present disclosure shall be defined by the claims.

The invention claimed is:

1. A base plate, comprising a substrate and a pixel defining layer arranged on the substrate, wherein the pixel defining layer comprises dams and a plurality of micron-sized protrusions arranged on the upper surfaces and sides of the dams; and the protrusions have lyophobic property, wherein the protrusions have a diameter of 0.5-5 μm, and adjacent protrusions have a distance therebetween of 0.5-5 μm; and a material for preparing the protrusions is obtained by modifying a main material for preparing the dams.

2. The base plate according to claim 1, wherein the protrusions have the same size and are arranged at equal intervals.

3. The base plate according to claim 1, wherein the protrusions are made of a negative photoresist material.

4. The base plate according to claim 1, further comprising an organic material functional layer arranged in grooves defined by the pixel defining layer; and the protrusions on the sides of the dams are located above the organic material functional layer.

5. A display panel, comprising the base plate according to claim 1.

6. A method for manufacturing a base plate, comprising forming a pixel defining layer on a substrate, wherein forming the pixel defining layer comprises:

a step of forming dams; and a step of forming a plurality of protrusions on the upper surfaces and sides of the dams, wherein the protrusions have lyophobic property, wherein the protrusions have a diameter of 0.5-5 μm, and adjacent protrusions have a distance therebetween of 0.5-5 μm; and a material for preparing the protrusions is obtained by modifying a main material for preparing the dams.

7. The method for manufacturing a base plate according to claim 6, wherein the protrusions have the same size and are arranged at equal intervals.

8. The method for manufacturing a base plate according to claim 7, wherein the step of forming a plurality of protrusions on the upper surfaces and sides of the dams comprises:

forming a negative photoresist material layer on the substrate on which the dams are formed; and forming the protrusions on the upper surfaces and sides of the dams by exposing and developing the negative photoresist material layer with a mask;

wherein the mask comprises first openings and second openings, the first openings are used for forming the protrusions on the upper surfaces of the dams, and the second openings are used for forming the protrusions on the sides of the dams;

the diameter ratio of the first openings to the protrusions is 5:1 to 5:4;

the diameter of the first openings is b, and the center distance of the adjacent first openings is y; the diameter of the second openings is $a=b\times\cos\theta$, and the center distance of the adjacent second openings is $x=y\times\cos\theta$; and θ is an included angle between the side of the dam and the horizontal plane.

9. The method for manufacturing a base plate according to claim 6, further comprising: forming an organic material functional layer through an ink jet printing process in grooves defined by the pixel defining layer;

wherein the protrusions on the sides of the dams are located above the organic material functional layer.

10. The base plate according to claim 1, wherein the material for preparing the protrusions includes a copolymer composed of two or more monomers of acrylic acid, isobutylene, methacrylate and styrene.

* * * * *